United States Patent [19]
Harada et al.

[11] Patent Number: 5,430,329
[45] Date of Patent: Jul. 4, 1995

[54] SEMICONDUCTOR DEVICE WITH BONDING PAD ELECTRODE

[75] Inventors: Shigeru Harada; Takemi Endoh; Tomohiro Ishida, all of Hyogo, Japan

[73] Assignee: Mitsubishi Denki Kabushiki Kaisha, Tokyo, Japan

[21] Appl. No.: 249,679

[22] Filed: May 26, 1994

Related U.S. Application Data

[63] Continuation of Ser. No. 88,597, Jul. 9, 1993, abandoned, which is a continuation of Ser. No. 819,739, Jan. 13, 1992, abandoned.

[30] Foreign Application Priority Data

Jan. 29, 1991 [JP] Japan .................... 3-009157

[51] Int. Cl.⁶ .................... H01L 23/29; H01L 23/485; H01L 29/41
[52] U.S. Cl. .................... 257/786; 257/639; 257/640; 257/642; 257/643; 257/644
[58] Field of Search .................... 357/65, 71; 257/782, 257/783, 784, 786, 763, 765, 764, 639, 640, 643, 644, 642

[56] References Cited

U.S. PATENT DOCUMENTS

| | | | |
|---|---|---|---|
| 4,733,289 | 3/1988 | Tsurumaru | 357/65 |
| 4,845,543 | 7/1989 | Okikawa et al. | 257/784 |

FOREIGN PATENT DOCUMENTS

| | | | |
|---|---|---|---|
| 0032263 | 3/1977 | Japan | 357/65 |
| 0220850 | 9/1989 | Japan | 257/784 |
| 0241832 | 9/1989 | Japan | 257/786 |
| 0007435 | 1/1990 | Japan | 257/737 |
| 0281743 | 11/1990 | Japan | 357/65 |
| 0184340 | 8/1991 | Japan | 357/65 |

OTHER PUBLICATIONS

Translation of Japan Kokai Publication 01-0220850, Sep. 1989 Toyosawa et al., 9 pages.
"Afterglow Chemical Vapor Deposition of SiO$_2$", R. L. Jackson, et al, Solid State Technology, Apr. 1987, pp. 107–111.
Patent Abstracts of Japan 02-0294037, Dec. 5, 1990, Furuta E-1035, Feb. 19, 1991, vol. 15, No. 70.
Patent Abstracts of Japan 01-0241832, Sep. 26, 1989, Matsuo E-864, Dec. 20, 1989, vol. 13, No. 578.

*Primary Examiner*—Rolf Hille
*Assistant Examiner*—Peter Toby Brown
*Attorney, Agent, or Firm*—Lowe, Price, LeBlanc & Becker

[57] ABSTRACT

A semiconductor device has a conductive interconnection layer formed on a semiconductor substrate covered with a protection insulation film. A pad electrode opening is provided in the protection insulation film so that the surface of the conductive interconnection layer is exposed in the region which becomes the pad electrode. The conductive interconnection layer is electrically connected to an external terminal by a bonding wire. At least the surface of the protection insulation film in the proximity of the pad electrode opening and the inner peripheral side face of the pad electrode opening are covered with an elastic insulation film. The pad electrode opening is covered with the bonding wire. Since the conductive interconnection layer is not exposed at the pad electrode opening according to this structure, the phenomenon of moisture intruding into the pad electrode opening to corrode the conductive interconnection layer is prevented to improve reliability. The semiconductor device of this structure is formed by covering the inner surface and its proximity of the pad electrode opening with an elastic insulation film, forming an opening in the elastic insulation film at the bottom of the pad electrode opening, and connecting the pad electrode to an external terminal by wire bonding.

14 Claims, 10 Drawing Sheets

SEMICONDUCTOR DEVICE WITH BONDING PAD ELECTRODE

This application is a continuation of application Ser. No. 08/088,597 filed Jul. 9, 1993, now abandoned, which is a continuation of application Ser. No. 07/819,739 filed Jan. 13, 1992, now abandoned.

BACKGROUND OF THE INVENTION

1. Field of the Invention

The present invention relates to a semiconductor device and a method of manufacturing thereof, and more particularly, to a semiconductor device having a structure in which a pad electrode in an interconnection layer on a semiconductor substrate is connected to an external terminal by wire bonding, and a method of manufacturing thereof.

2. Description of the Background Art

Various wirings are used in a semiconductor device for electrically connecting elements formed on the semiconductor substrate to each other.

It is also necessary to electrically connect an interconnection layer of this semiconductor substrate to an external terminal of a semiconductor device or a package. This was carried out by a method of connecting a pad electrode of an interconnection layer formed on a semiconductor substrate to an external terminal by wire bonding.

FIG. 1 is a sectional view of a conventional semiconductor device having such a structure. A bonding pad electrode 21 is formed on a semiconductor chip 20 having devices formed thereon. The main surface of semiconductor chip 20 is covered with a protection insulation film 22. A die pad 23a on which semiconductor chip is placed implements a lead frame 23 with an external terminal (lead) 23b. Pad electrode 21 on semiconductor chip 20 is connected to external terminal (lead) 23b by a bonding wire 24. Chip 20 is sealed with a molding resin material 25.

The structure of semiconductor chip 20 will be described hereinafter with an enlarged portion of A of FIG. 1 taking a DRAM (Dynamic Random Access Memory) device as an example.

FIG. 2 is a sectional view showing a conventional DRAM device. A DRAM device (stacked cell) 2 is formed on the surface of a silicon semiconductor substrate 1. A first insulation film 3 is deposited on a DRAM device (stacked cell) 2. A first interconnection layer 4 is formed on first insulation film 3. A second insulation film 5 is deposited as a protection insulation film on first interconnecting wiring 4. Second insulation film 5 corresponds to protection insulation film 22 of FIG. 1. Bonding pad electrode 6 is connected to external terminal (lead) 23b of FIG. 1 by bonding wire 24 through a bonding pad electrode opening 7, and sealed with molding resin sealing material 25.

In this conventional structure, bonding pad electrode 6 is not covered with the material of bonding wire 24. Such wire bonding of a bonding pad is disclosed in Japanese Patent Laying-Open No. 52-32263, for example.

An example of a manufacture flow of a conventional semiconductor device will be explained hereinafter mainly on the bonding pad electrode formation step and the wire bonding step.

Referring to FIG. 3A, a DRAM device (stacked cell) 2 constituted by an element isolation oxide film 301, a transfer gate electrode 302, an impurity diffusion layer 303, a word line 304, a storage node 305, a capacitor insulation film 306 and a cell plate 307 is formed on the surface of a silicon semiconductor substrate 1.

Referring to FIG. 3B, a first insulation film 3 is deposited all over silicon semiconductor substrate 1 having DRAM device (stacked cell) 2 formed thereon. Then, a contact hole 308 is formed at a desired location using photolithography and etching.

Next, an aluminum interconnection layer which is first interconnection layer 4 is formed as the bit line. In recent submicron devices, an interconnection layer formed of a combined structure of a barrier metal film 309 such as of titanium nitride (TiN) and titanium-tungsten (TiW) and an aluminum alloy film 310 such as of Al-Si, Al-Si-Cu is used as the first layer of aluminum interconnection layer 4 to: (1) prevent junction leak due to abnormal reaction (alloy spike) between aluminum and the silicon substrate (impurity diffusion layer) at the contact, (2) prevent contact fault caused by silicon in the aluminum alloy film precipitating into the contact due to solid phase epitaxial growth, (3) improve tolerability to "stress migration" where the interconnection layer is disconnected by film stress of the interlayer insulation film and protection insulation film formed over the aluminum interconnection layer.

The above-mentioned layers are generally deposited by sputtering, and patterned as first aluminum interconnection layer 4 and bonding pad electrode 6 using photolithography and etching.

Then, a silicon oxide film is deposited as protection insulation film 5 over first interconnection layer 4 by chemical vapor deposition (CVD) using plasma at a film deposition temperature of 300°–400° C. with monosilane (SiH$_4$) and nitrous oxide (N$_2$O) gas, for example (FIG. 3C).

A silicon nitride film or a silicon oxynitride film comprising the characteristics of low transmittance of water and the like and high mechanical strength in comparison with a silicon oxide film, or a combination of these may be used for protection insulation film 5.

In the case of silicon nitride film, protection insulation film 5 is deposited using the above-described CVD method using plasma with monosilane (SiH$_4$) and ammonia (NH$_3$) gas. In the case of silicon oxynitride film, the protection insulation film is deposited using monosilane (SiH$_4$), ammonia (NH$_3$) and nitrous oxide (N$_2$O) gas.

The deposited protection insulation film 5 has an opening formed by lithography or etching to provide a bonding pad electrode opening 7 for wire bonding, as shown in FIG. 3D.

Semiconductor substrate 1 having a device formed is cut out as a semiconductor chip 20 by dicing. Semiconductor chip 20 is attached to die pad 23a on lead frame 23 of FIG. 1 by soldering or using conductive resin and the like.

Next, bonding pad electrode 6 is connected to lead 23b of lead frame 23 with a bonding wire 24 formed of a gold wire and the like via bonding pad electrode opening 7 (FIG. 3E).

The gold wire and the like is connected by thermal compression, or by a bonding method combining the usage of thermal compression and ultrasonic.

Lastly, the whole portion is packaged by molding resin 25 (FIG. 3F).

A conventional molding resin sealed type semiconductor device provokes the following problems since aluminum film 311 of bonding pad electrode 6 is exposed around wire bonding material 24.

The exposed portion of aluminum film 311 is corroded by moisture 312 intruding through molding resin 25 to generate a hole 313. Therefore, the likelihood increases of reliability (moisture resistance) failure that is an electrical open failure at bonding pad electrode 6.

The size of a bonding pad is reduced in proportion to the number of terminal pins which are recently increasing corresponding to multifunctions of a semiconductor device. Also, the thickness of a semiconductor device package, substantially the thickness of the mold resin is reduced corresponding to high density surface mounting. These semiconductor devices will be more easily affected by intruding moisture, so that the above-described problem will become more serious.

SUMMARY OF THE INVENTION

An object of the present invention is to provide a semiconductor device of high reliability having sufficient moisture resistance even when the size of a bonding pad electrode is small and the thickness of the package is thin.

Another object of the present invention is to provide a method of manufacturing a semiconductor device that does not have a crack generated in a protection insulation. film caused by mechanical strength exerted at the time of wire bonding between a bonding pad electrode and an external terminal.

A semiconductor device of the present invention for accomplishing the first mentioned object has a protection insulation film covering a conductive interconnection layer formed on a semiconductor substrate. A pad electrode opening is formed in the protection insulation film to expose the surface of the conductive layer interconnection layer at a region serving as a pad electrode. The conductive interconnection layer is electrically connected to an external terminal by a bonding wire. The surface of the protection insulation film is covered with an elastic insulation film at least in the proximity of the pad electrode opening and at the inner peripheral side face of the pad electrode opening. The pad electrode opening is filled with the bonding wire.

According to the semiconductor device having the above described structure, the conductive interconnection layer is not exposed at the pad electrode opening since the pad electrode opening is filled with a bonding wire. This prevents the phenomenon of moisture intruding into the pad electrode opening to corrode the conductive interconnection layer, resulting in a hole.

A method of manufacturing a semiconductor device of the present invention for accomplishing the second-mentioned object includes the followings steps.

A protection insulation film of a predetermined thickness is formed on a conductive interconnection layer formed on a semiconductor substrate with an insulation film therebetween. A hole is formed in the protection insulation film at the region of the conductive interconnection layer serving as the pad electrode so that the surface of the conductive interconnection layer is exposed. This hole is the pad electrode opening.

Then, the surface of the-protection insulating film is covered with an elastic insulation film at least on the surface of the proximity of the pad electrode opening and on the inner surface of the pad electrode opening. Then, an opening is formed in the elastic insulation film at the portion above the bottom of the pad electrode opening to expose the surface of the conductive interconnection layer at the region which becomes the pad electrode.

The pad electrode and an external terminal is connected by a wire bonding.

According to this method of manufacturing, mechanical impact force exerted on the pad electrode opening at the time of wire bonding is absorbed by the elasticity of the elastic insulation film to prevent the generation of a crack in the protection insulation film. This prevents moisture from intruding into the surface of the conductive interconnection layer to corrode and form a hole in the conductive interconnection layer to invoke disconnection, all caused by a crack.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device according to a first embodiment of the present invention will be explained hereinafter with reference to FIG. 5.

Figure 1:
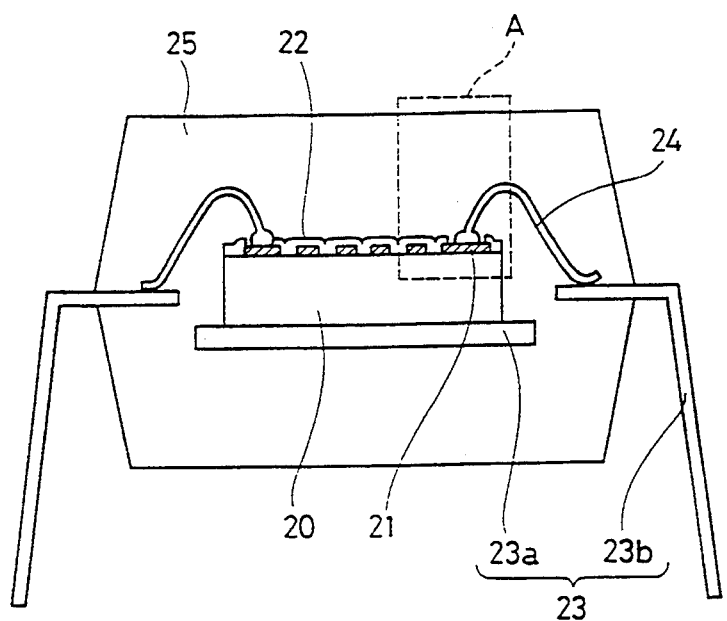
FIG. 1 is a sectional view showing an example of a structure of a conventional semiconductor device.
Figure 2:
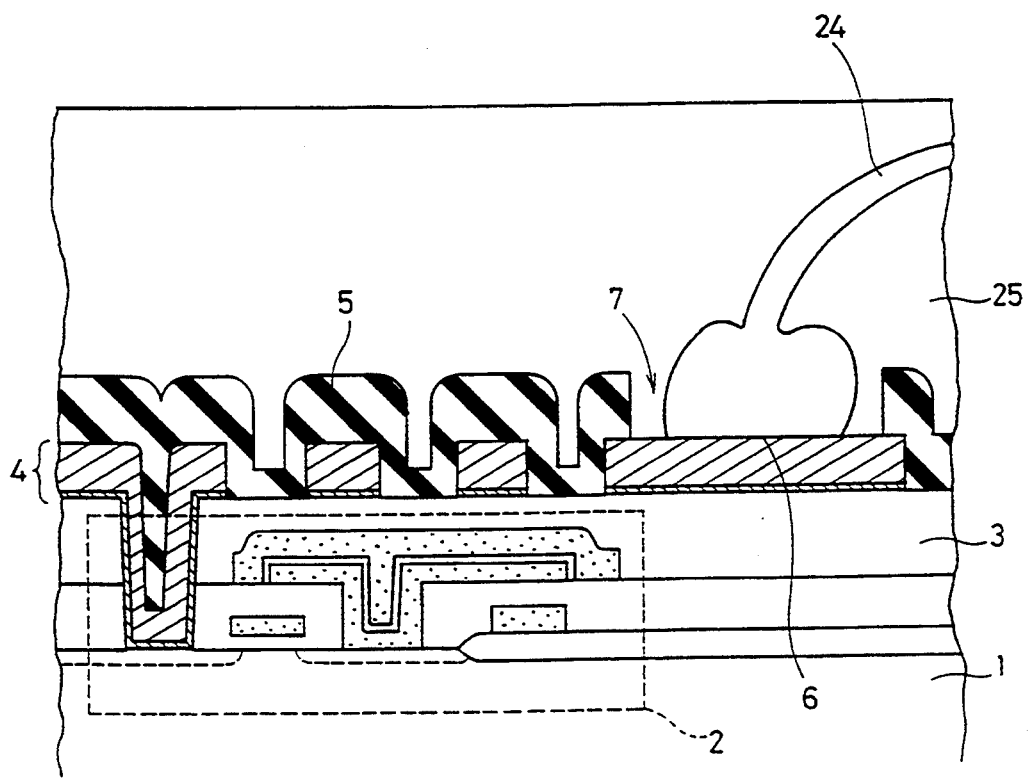
FIG. 2 is a sectional view of a structure of a conventional DRAM device.
Figure 3A:
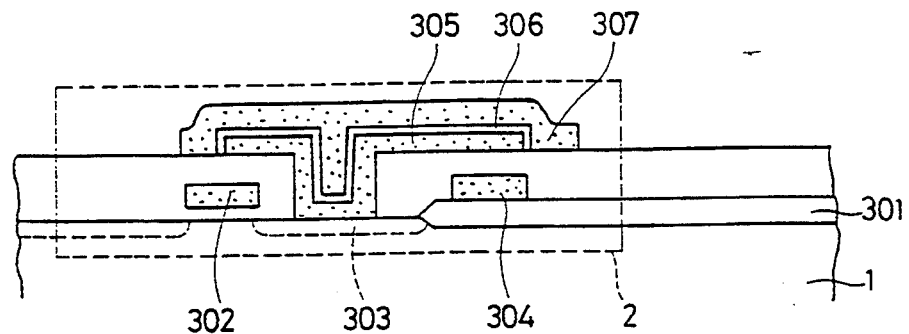
FIGS. 3A, 3B, 3C, 3D, 3E and 3F are sectional views of a conventional DRAM device showing in order its manufacturing steps.
Figure 3B:
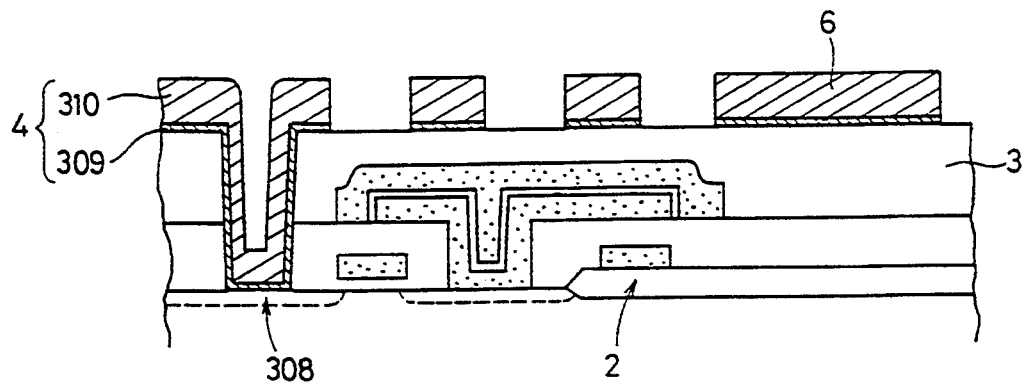
Figure 3C:
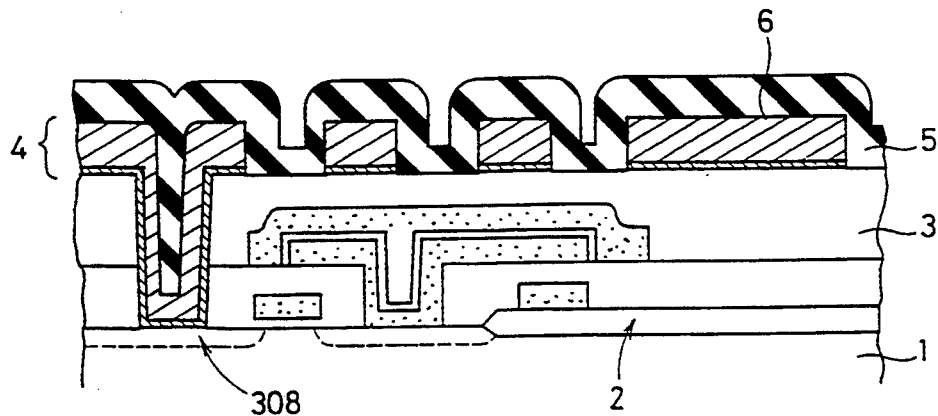
Figure 3D:
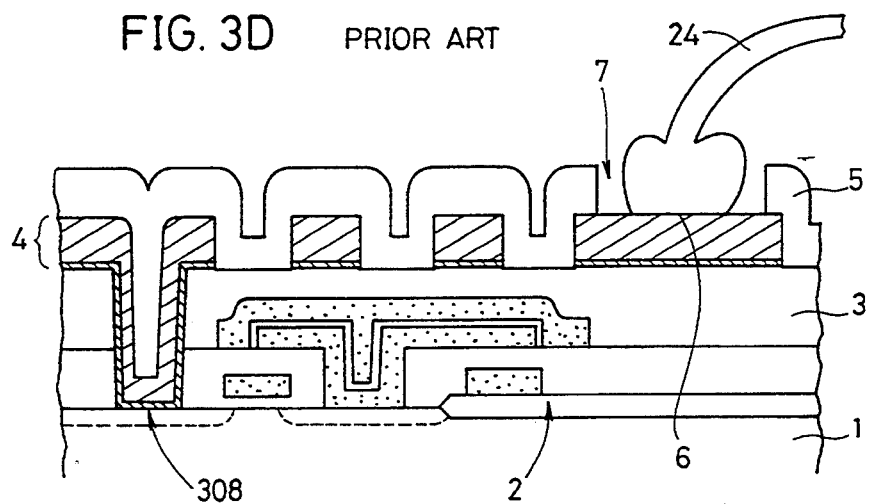
Figure 3E:
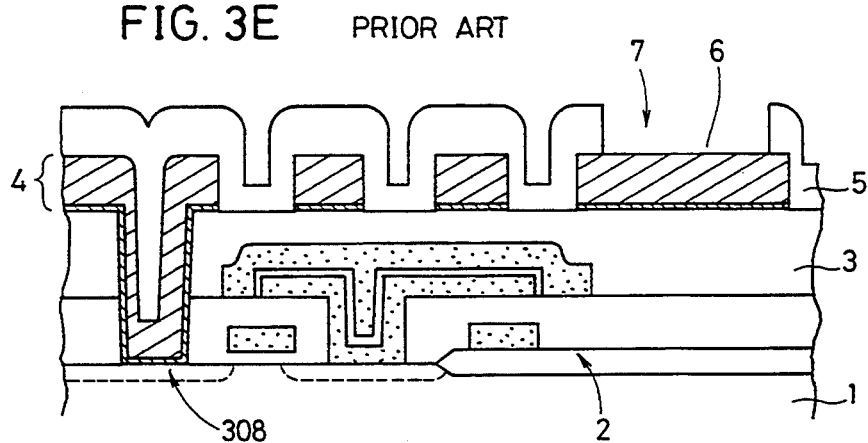
Figure 3F:
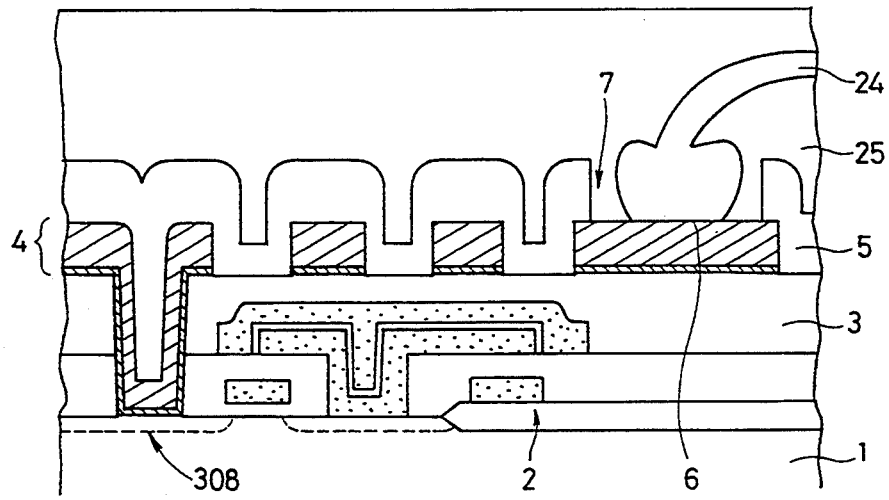
Figure 4:
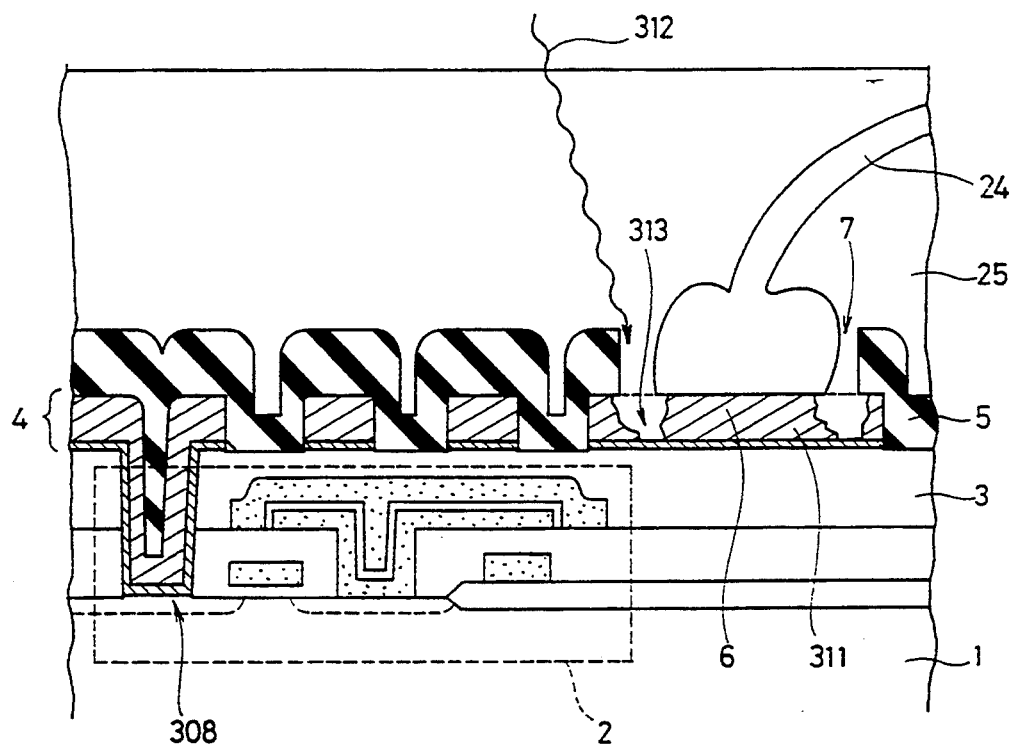
FIG. 4 is a sectional view for explaining a problem of a conventional semiconductor device.
Figure 5:
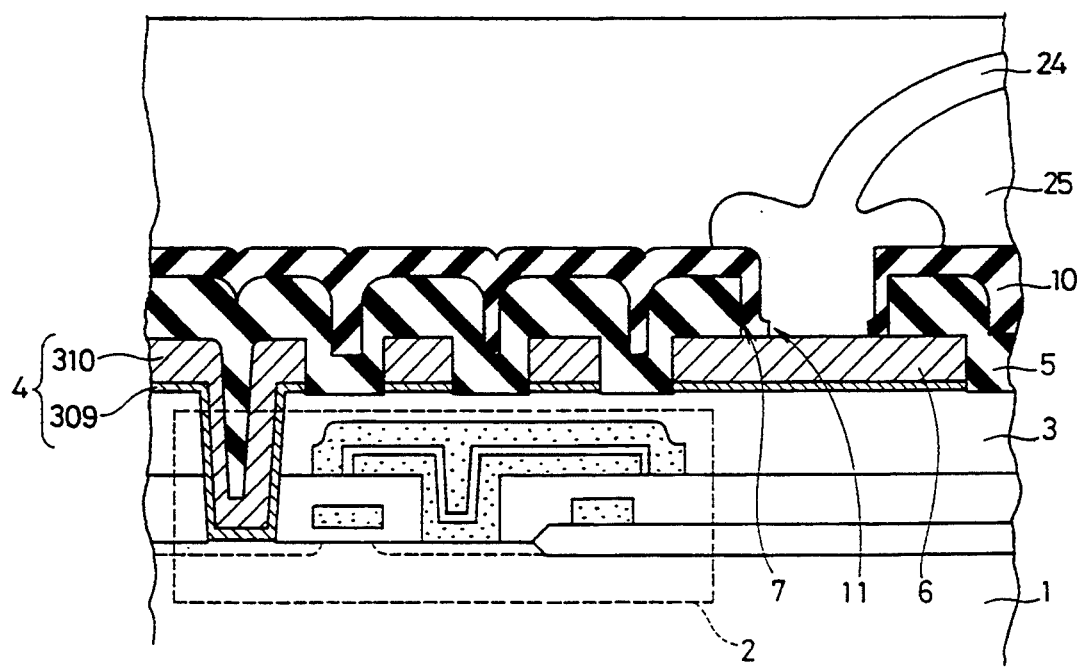
FIG. 5 is a sectional view showing a structure of a semiconductor device according to a first embodiment of the present invention.

Referring to FIG. 5, a DRAM device (stacked cell) 2 is formed on the surface of a silicon semiconductor substrate 1. A first insulation film 3 is deposited on DRAM device 2, with a first conductive interconnection layer 14 formed thereon. A second insulation film (protection insulation film) 5 is deposited on first interconnection layer 4. First conductive interconnection layer 4 has a bonding pad electrode 6 for connecting an external terminal (lead) 23b with a wire bonding. A pad electrode opening 7 is formed in second insulation film 5 at the region of bonding pad electrode 6 to expose the surface of first conductive interconnection layer 4. The inner peripheral sidewall of pad electrode opening 7 and the surface of second insulation film 5 are covered with an elastic insulation film 10. First conductive interconnection layer 4 is connected to external terminal 23b by bonding wire 24 at an opening 11 of elastic insulation film 10 within pad electrode opening 7. The entire surface of semiconductor substrate 1 is covered with a molding resin sealing material 25.

The semiconductor device of the present embodiment has bonding wire 24 formed to fill pad electrode opening 7, so that moisture does not intrude into the surface of first conductive interconnection layer 4. Therefore, generation of a hole due to corrosion in first conductive interconnection layer 4 will be prevented.

An example of the manufacturing steps of the semiconductor device of the first embodiment of the present invention shown in FIG. 5 will be described with reference to FIGS. 6A–6G mainly on the bonding pad electrode 6 formation step and the wire bonding step.

Figure 6A:
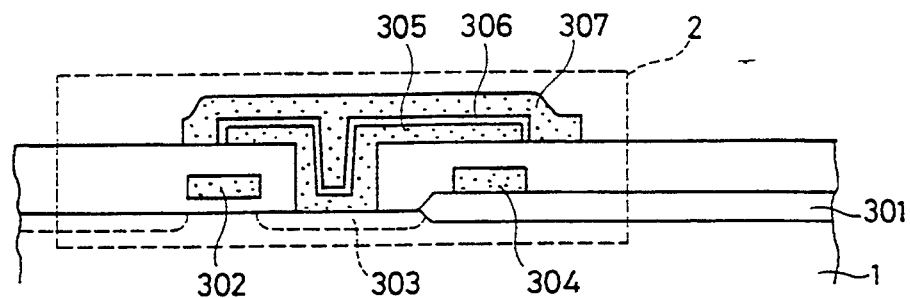
FIGS. 6A, 6B, 6C, 6D, 6E, 6F and 6G are sectional views of the semiconductor device of FIG. 5 showing in order its manufacturing steps.

Referring to FIG. 6A, DRAM device (stacked cell) 2 constituted by element isolation oxide film 301, transfer gate electrode 302, impurity diffusion layer 303, word line 304, storage node 305, capacitor insulation film 306, and cell plate 307 is formed on the surface of silicon semiconductor substrate 1.

Figure 6B:
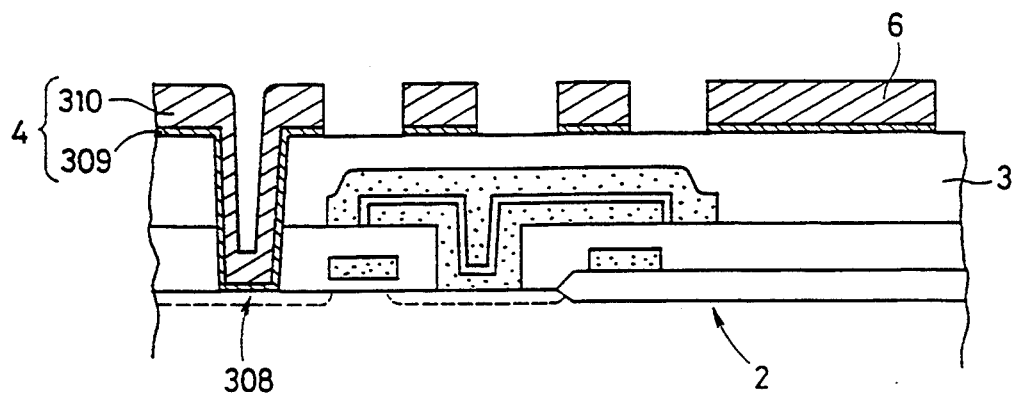

Referring to FIG. 6B, first insulation film 3 is deposited all over the surface of silicon semiconductor substrate 1 having DRAM device (stacked cell) 2 formed thereon. Then, contact hole 308 is formed at a desired position by photolithography and etching.

Then, an aluminum interconnection layer is formed which is first interconnection layer 4 serving as a bit line. Similar to conventional cases, a structure is used of a combination of barrier metal film 309 such as titanium nitride (TiN) and titanium-tungsten (TiW) and aluminum alloy film 310 such as Al-Si, Al-Si-Cu to be patterned as first aluminum interconnection layer 4 and bonding pad electrode 6 by photolithography and etching.

Figure 6C:
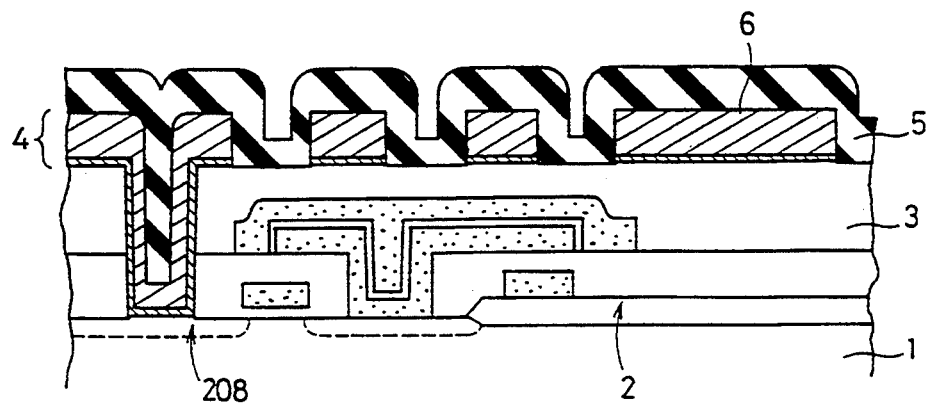

Next, a silicon oxide film, a silicon nitride film, or a silicon oxynitride film is deposited as protection insulation film 5 on first interconnection layer 4 by CVD method using plasma at a film deposition temperature of 300°–400° C. using monosilane (SiH$_4$) and nitrous oxide (N$_2$O) gas, for example, similar to a conventional case (FIG. 6C).

Figure 6D:
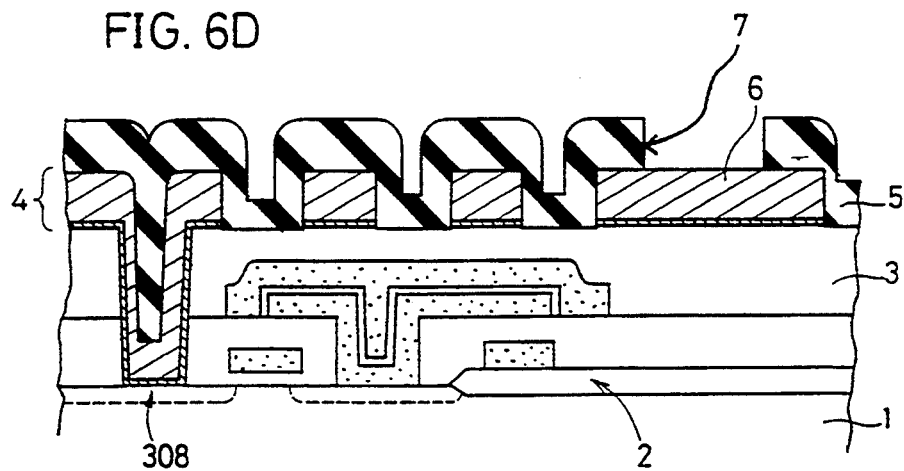

Then, bonding pad electrode opening 7 for wire bonding is formed using photolithography and etching (FIG. 6D).

This step differs from that of a conventional one in that bonding pad electrode opening 7 is formed so that the inner diameter thereof is smaller than the ball diameter 12 of bonding wire 24.

Next, elastic insulation film 10 such as of a polyimide resin type or a silicone resin type is formed on the surface of protection insulation film 5.

Figure 6E:
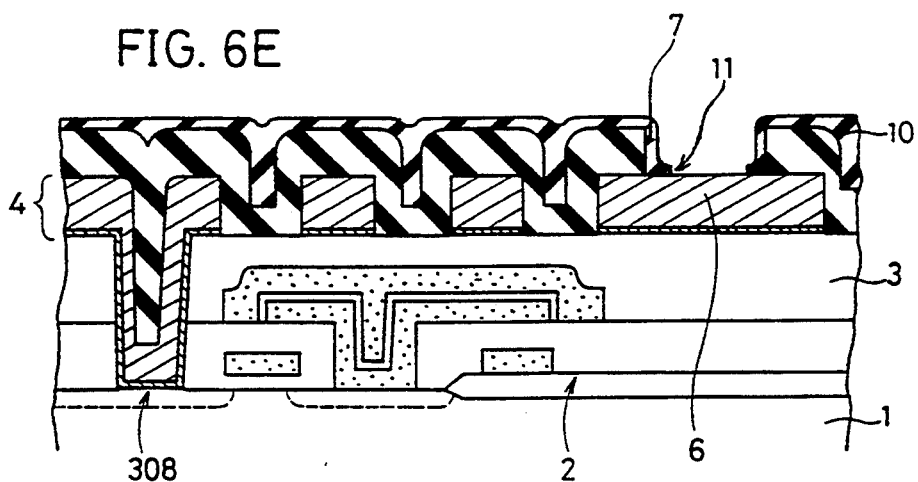

A typical formation method of applying the resin material is carried out by spin coating. Then, bonding pad electrode 6 is exposed using photolithography and etching to form opening 11 in elastic insulation film 10 (FIG. 6E).

Figure 7:
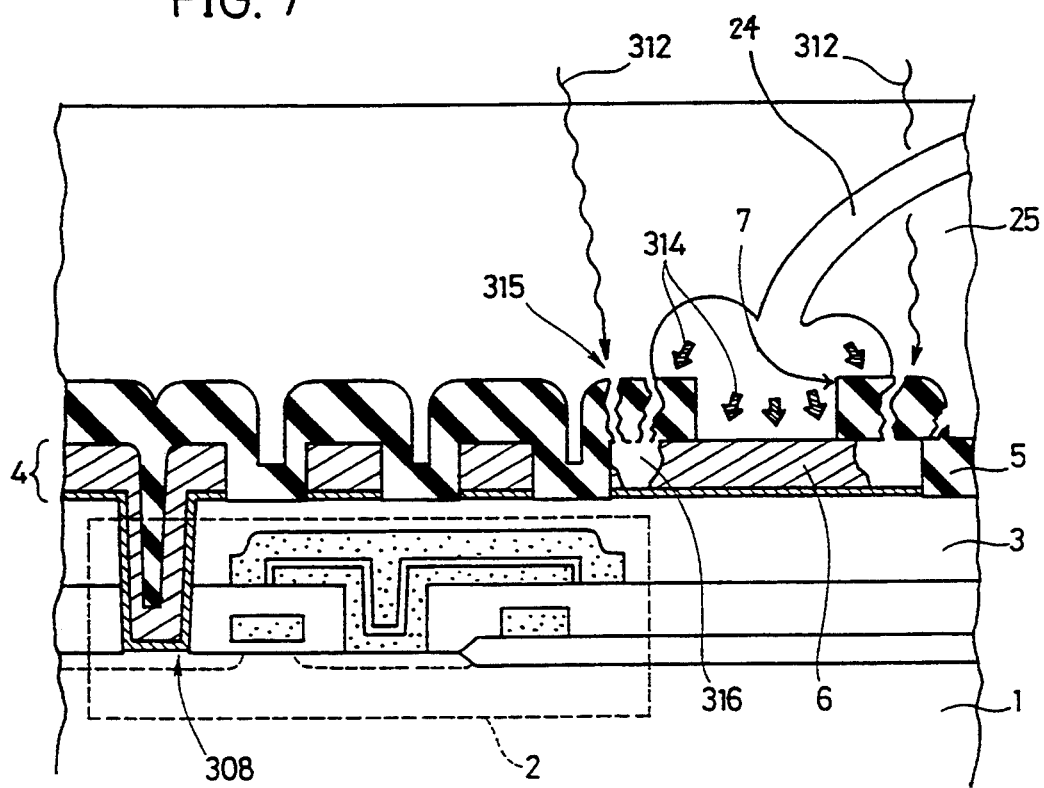
FIG. 7 is a sectional view for explaining a problem when there is no elastic insulation film 10.

Opening 11 of elastic insulation film 10 is provided to be inner of opening 7 of protection insulation film 5 so that mechanical strength is not directly exerted upon the protection insulation film at the time of wire bonding. Otherwise, a crack 315 will be generated in protection insulation film 5 by the exertion of mechanical strength 314 such as of ultrasonic and pressure application at the time of wire bonding upon protection insulation film 5 on an aluminum film which is bonding pad electrode 6, as shown in FIG. 7.

Crack 315 is not desirable since it becomes the cause of disconnection failure due to intruding moisture 312 corroding aluminum interconnection layer 4 to form a hole 316.

Semiconductor substrate 1 having devices formed thereon is cut out as semiconductor chip 20 by dicing to be attached to die pad 23a of lead frame 23 by soldering or using conductive resin and the like, similar to the case of a conventional semiconductor device.

Figure 6F:
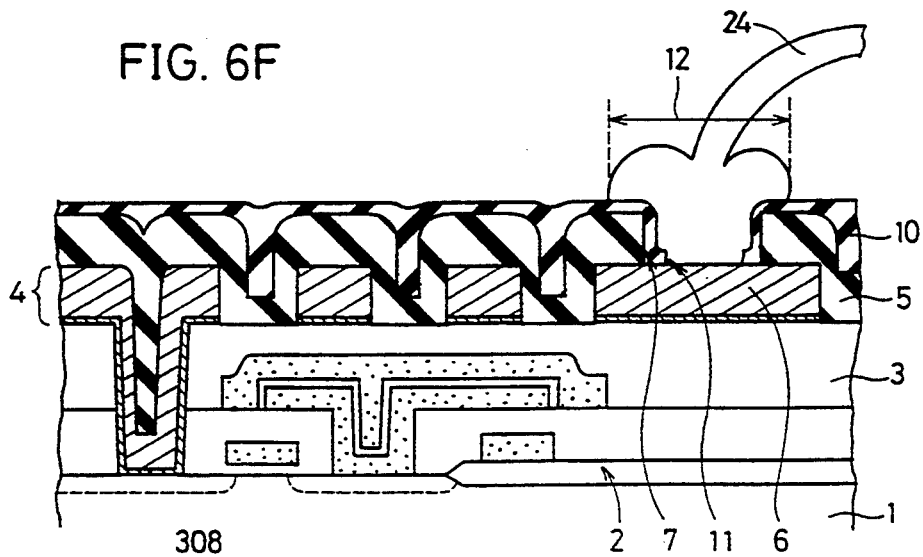

Opening 11 of elastic insulation film 10 is connected to lead 23b of lead frame 23 with bonding wire 24 such as a gold wire (FIG. 6F).

The ball diameter 12 of the wire bonding is to be greater than the diameter of opening 11 of the bonding pad electrode.

A crack will not be generated in protection insulation film 5 since elastic insulation film 10 formed thereabove prevents mechanical strength 314 at the time of wire bonding from being exerted directly upon protection insulation film 5.

Figure 6G:
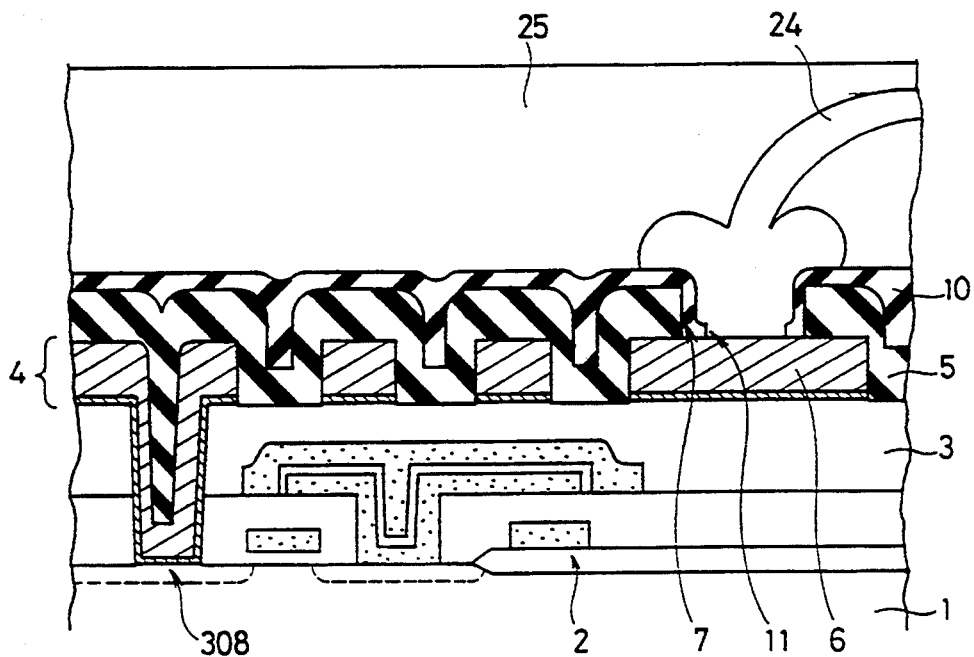

Lastly, the entire device is packaged by molding resin 25 (FIG. 6G).

Figure 8:
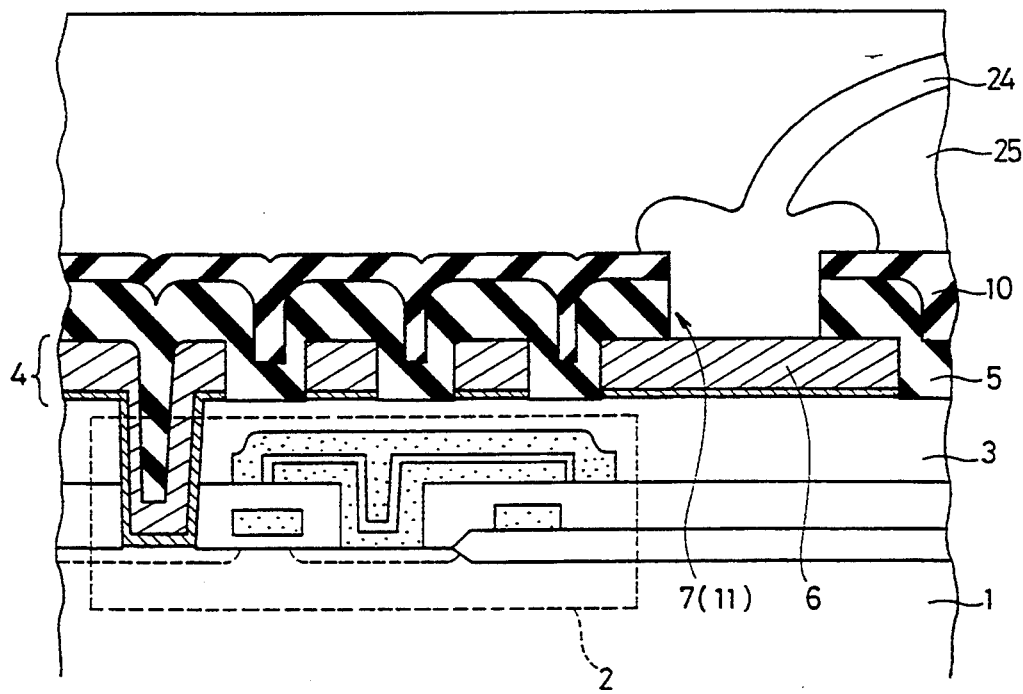
FIG. 8 is a sectional view showing a structure of a semiconductor device according to a second embodiment of the present invention.

Although the above-described first embodiment shows the case where opening 11 of insulation film 10 having elasticity is smaller than bonding pad opening 7 at bonding pad electrode 6, a second embodiment is shown in FIG. 8 where a similar effect can be obtained by forming simultaneously opening 11 of elastic insulation film 10 and bonding pad electrode opening 7 with substantially equal dimensions when the influence of mechanical strength at the time of bonding can be reduced with wire bonding technique.

Figure 9:
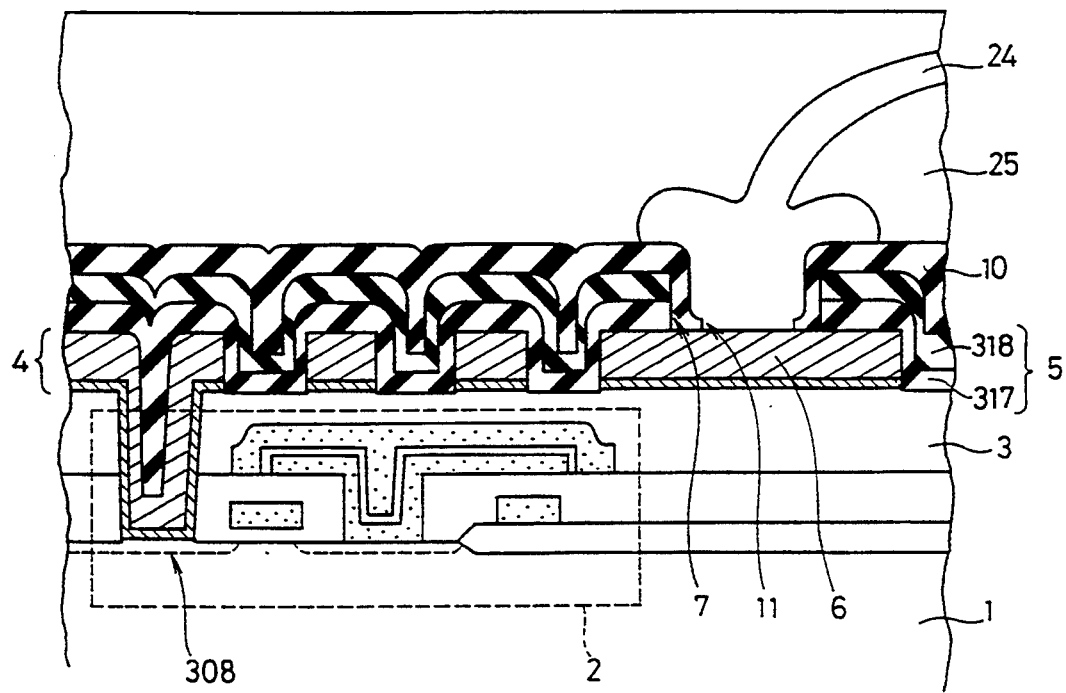
FIG. 9 is a sectional view showing a structure of a semiconductor device according to a third embodiment of the present invention.

Although the first embodiment was described in which protection insulation film 5 is a single layer film such as silicon oxide film, a silicon nitride film, or a silicon oxynitride film, the protection insulation film shown in FIG. 9 as the third embodiment may be, for example, a combination of the above films with a layered structure of a silicon oxide film 317 and a silicon nitride film 318.

Figure 10:
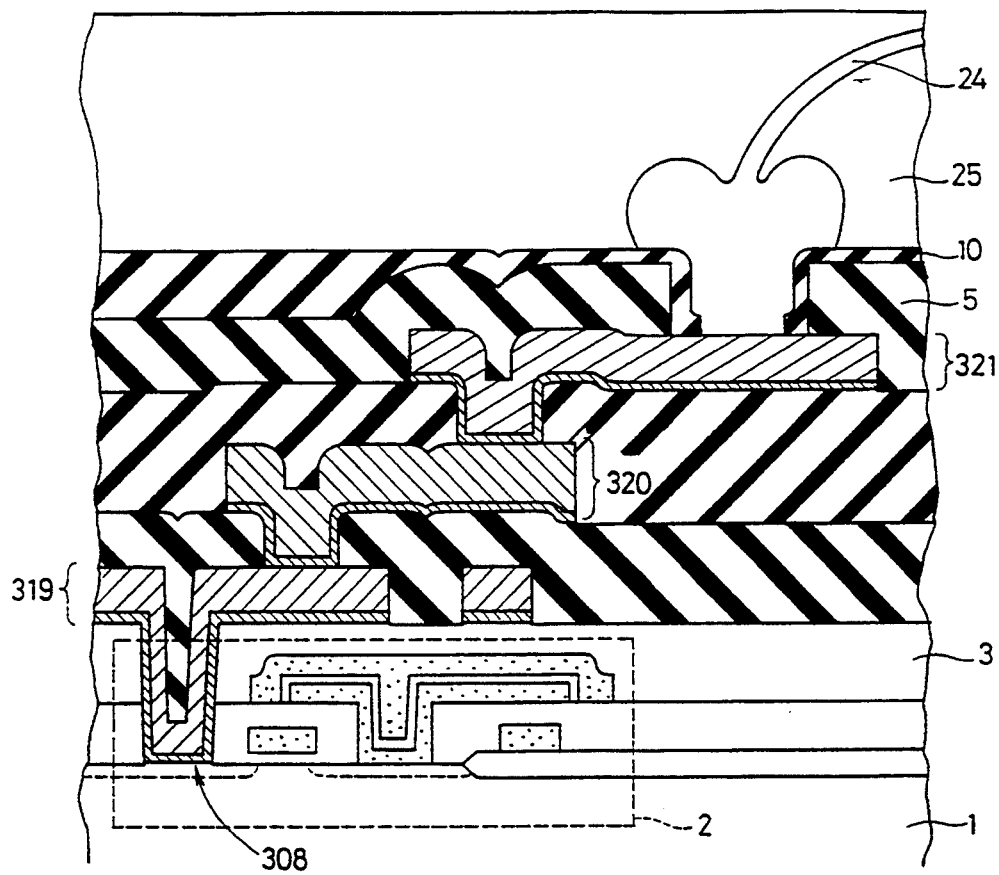
FIG. 10 is a sectional view showing a structure of a semiconductor device according to a fourth embodiment of the present invention.

The first embodiment was described in which the interconnection layer structure was a single layer and the first interconnection layer was an aluminum interconnection layer. As a fourth embodiment shown in FIG. 10, a similar effect can be obtained with a multilayered interconnection layer structure of first interconnection layer 319 formed of another metal interconnection layer such as refractory metal (W, Mo, Ti, etc.), refractory metal silicide (WSi$_2$, MoSi$_2$, TiSi$_2$, etc.) interconnection, or a polycrystalline silicon interconnection layer, with a plurality of interconnection layers 320 and 321 such as an aluminum layer of two or more layers.

Figure 11:
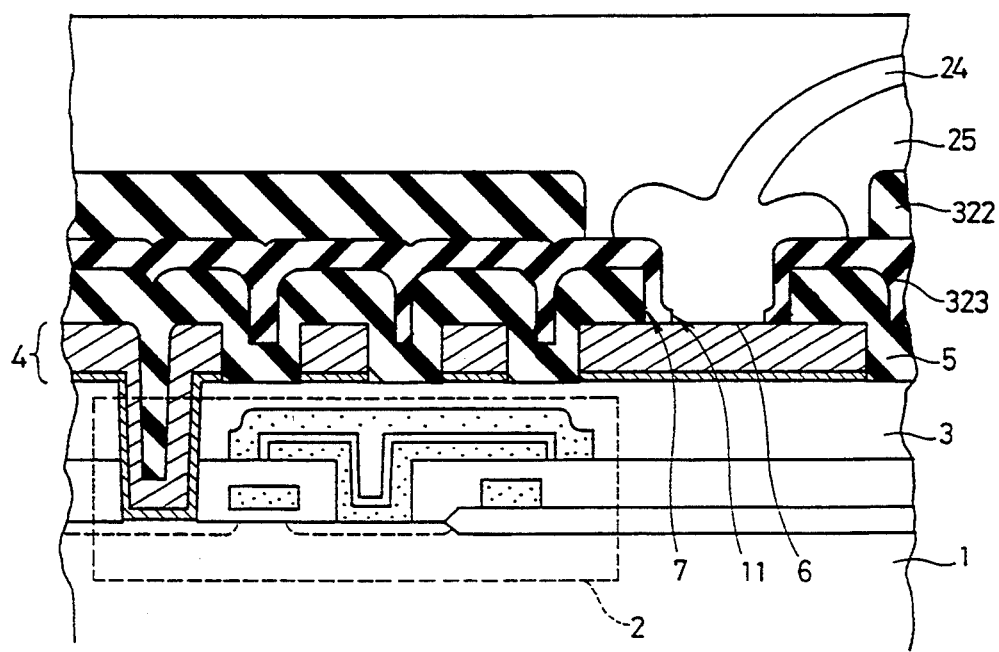
FIG. 11 is a sectional view showing a structure of a semiconductor device according to a fifth embodiment of the present invention.

The first embodiment was described in which elastic insulation film 10 formed on protection insulation film 5 is a single layer film. FIG. 11 shows a fifth embodiment where an elastic insulation film 322 formed on the main portion of the semiconductor chip excluding bonding pad opening 7, and an elastic insulation film 323 provided in the proximity of the bonding pad may be implemented with a different material and a different film thickness. The material of elastic insulation films 10, 322 and 323 may include a polyimide resin type insulation film and a silicone resin type insulation film.

Figure 12:
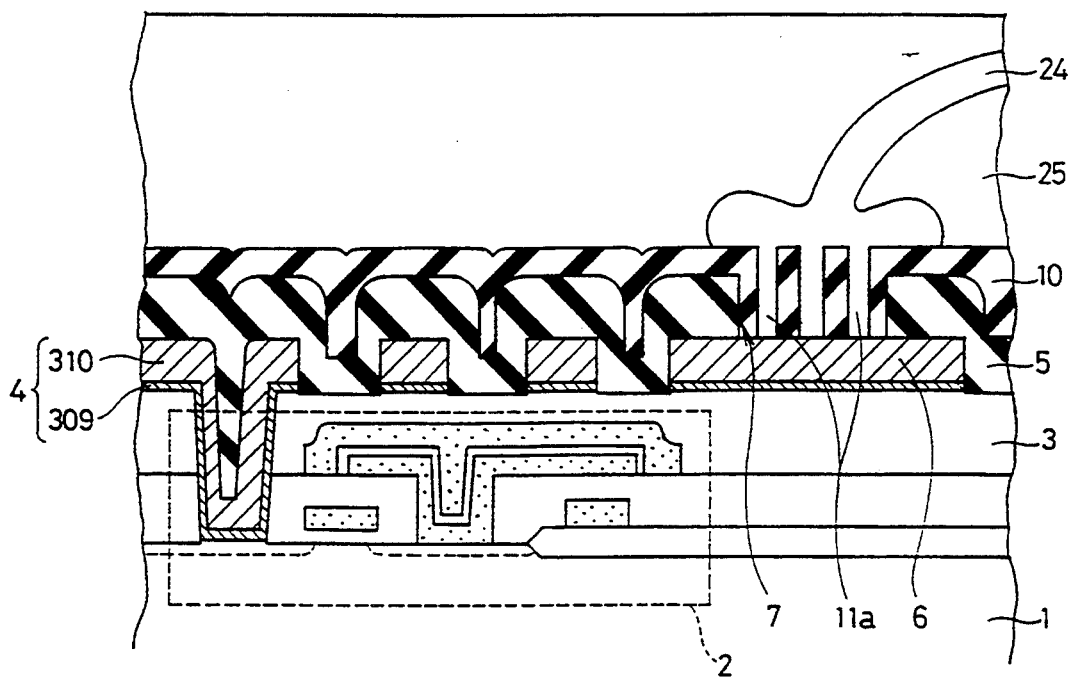
FIG. 12 is a sectional view showing a structure of a semiconductor device according to a sixth embodiment of the present invention.

FIG. 12 shows a sixth embodiment in which bonding pad opening 7 comprises a plurality of small openings.

Although the present invention was applied to a semiconductor device having DRAM device 2 formed on the surface of semiconductor substrate 1, a similar effect can be obtained by applying the present invention to other semiconductor devices having an aluminum interconnection layer.

Figure 13:
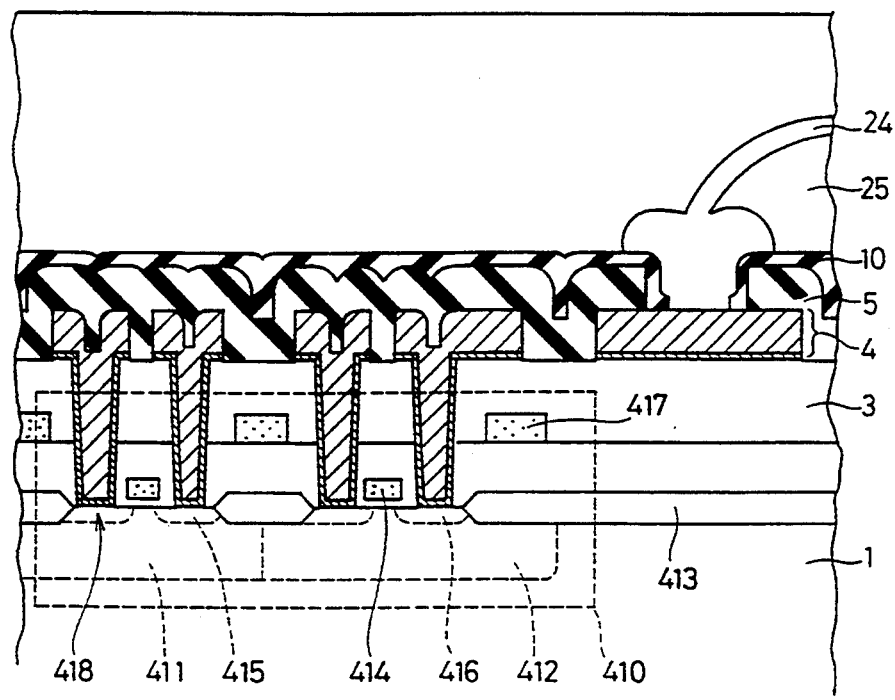
FIG. 13 is a sectional view showing a structure of a semiconductor device according to a seventh embodiment of the present invention.

For example, FIG. 13 shows a seventh embodiment in which the bonding pad electrode structure of the present invention is applied to a semiconductor device having a SRAM (Static Random Access Memory) formed on the surface of the substrate.

Referring to FIG. 13, a p type well region 411, an n type well region 412, an element isolation oxide film 413, a gate electrode 414, an n type impurity diffusion layer 415, a p type impurity diffusion layer 416, a polycrystalline silicon interconnection layer 417, and a contact hole 418 implementing a SRAM [double well CMOS (Complementary Metal Oxide Semiconductor) structure] is formed on the surface of silicon semiconductor substrate 1. An underlying insulation film 3 is deposited on SRAM 410, with a first aluminum interconnection layer 4 formed on underlying insulation film 3. A second insulation (protection insulation film) film 5 is formed on first aluminum interconnection layer 4. Also, a bonding pad electrode 6 for connection to an external terminal (lead) 23b, a bonding pad opening 7, an elastic insulation film 10, an opening 11 of elastic insulation film 10, an opening 11 of elastic insulation film 10, and a bonding wire 24 for connecting an external terminal (lead) 23b are formed. The top of elastic insulation film 10 is molded with a seal molding resin material.

Similarly, the device formed on the surface of the semiconductor substrate 1 may be a device other than a DRAM or a SRAM, such as an EPROM (Erasable Programmable Read Only Memory), E²PROM (Electrical Erasable Programmable ROM) device, a microcomputer circuit device, a CMOS logic circuit device, and a bipolar transistor device.

According to the semiconductor device of the above-described embodiments, the first conductive interconnection layer is not exposed at pad electrode 6 to prevent the formation of a hole, since an elastic insulation film 10 is provided at least on the surface of first insulation film 5 in the proximity of pad electrode opening 7, with the bonding wire covering pad electrode opening 7. The generation of a crack is at the time of wire bonding also prevented so that a semiconductor device of high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate,
   a conductive interconnection layer formed on said semiconductor substrate and including a pad electrode,
   a protection insulation film covering said conductive interconnection layer and having an opening to expose said pad electrode,
   an elastic insulation film covering a portion of said protection insulation film, and
   a bonding wire of a material different from and less susceptive to corrosion by moisture than said pad electrode, which bonding wire is formed in said opening, in contact with said pad electrode and said elastic insulation film so as to completely cover said opening, and laterally spaced apart from said protection insulation film by said elastic insulation film.

2. The semiconductor device according to claim 1, wherein said elastic film comprises an insulation layer made of a material selected from the group consisting of polyimide resin and silicone resin.

3. The semiconductor device according to claim 1, wherein said protection insulation film comprises at least one type of an insulation film selected from the group consisting of a silicon oxide film, a silicon nitride film, and a silicon oxynitride film.

4. The semiconductor device according to claim 1, wherein said elastic insulation film at the position of said pad electrode opening comprises an opening positioned inside of the inner peripheral wall of said pad electrode opening.

5. The semiconductor device according to claim 1, wherein said conductive interconnection layer comprises a layer made of a material selected from the group consisting of aluminum and aluminum alloy.

6. The semiconductor device according to claim 1, wherein said conductive interconnection layer comprises an interconnection layer of a material selected from the group consisting of refractory metal interconnection layer, refractory silicide interconnection layer, and polycrystalline silicon interconnection layer.

7. The semiconductor device according to claim 1, wherein said elastic insulation film comprises a plurality of small openings.

8. The semiconductor device according to claim 1, wherein said conductive interconnection layer comprises a structure of a combination of a barrier metal film including titanium and a material selected from the group consisting from aluminum and aluminum alloy.

9. The semiconductor device of claim 1, wherein said elastic insulation film comprises a plurality of insulation layers of different thicknesses made of different materials.

10. The semiconductor device of claim 1, wherein said elastic insulation film comprises a plurality of insulation layers of different thicknesses.

11. The semiconductor device of claim 1, wherein said elastic insulation film comprises a plurality of insulation layers made of different materials.

12. A semiconductor device comprising:
    a semiconductor substrate,
    a conductive interconnection layer formed on said semiconductor substrate and including a pad electrode,
    a protection insulation film covering said conductive interconnection layer and having an opening to expose said pad electrode,
    an elastic insulation layer covering a portion of said protection insulation film surrounding said opening and a portion of said pad electrode exposed by said protection insulation film, a bonding wire of a material different from and less susceptive to corrosion by moisture than said pad electrode, which bonding wire is in contact with said elastic insulation layer and said pad electrode, and electrically connecting said conductive interconnection layer with an external terminal, said wire completely covering said opening, said elastic insulation layer being interposed between the bonding wire and the protection insulation layer to reduce mechanical force applied to, and hence prevent cracks forming in, said protection insulation film during bonding of said bonding wire to said conductive interconnection layer.

13. A semiconductor device comprising:
a semiconductor substrate,
a conductive interconnection layer formed on said semiconductor substrate and including a pad electrode,
a protection insulation film covering said conductive interconnection layer and having an opening to expose said pad electrode,
an elastic insulation layer covering a portion of said protection insulation film surrounding said opening and a portion of said pad electrode exposed by said protection insulation film,
a bonding wire of a material different from and less susceptive to corrosion by moisture than said pad electrode, which bonding wire is in contact with said elastic insulation layer and said pad electrode, and electrically connecting said conductive interconnection layer with an external terminal, said wire completely covering said opening,
said elastic insulation layer being interposed between the bonding wire and the protection insulation layer, wherein said elastic insulation layer has a greater elasticity than said protection insulation layer.

14. A semiconductor device comprising:
a semiconductor substrate,
a conductive interconnection layer formed on said semiconductor substrate and including a pad electrode,
a first insulation film comprising at least one type of insulation film selected from the group consisting of a silicon oxide film, an silicon nitride film, and a silicon oxynitride film, covering said conductive interconnection layer and having an opening to expose said pad electrode,
a second insulation layer selected from the group consisting of a polyimide resin and a silicon resin, covering a portion of said first insulation film surrounding said opening and a portion of said pad electrode exposed by said first insulation film,
a bonding wire of a material different from and less susceptive to corrosion by moisture than said pad electrode, which bonding wire is in contact with said second insulation layer and said pad electrode, and electrically connecting said conductive interconnection layer with an external terminal, said wire completely covering said opening,
said second insulation layer being interposed between the bonding wire and the first insulation layer to reduce mechanical force applied to, and hence prevent cracks forming in, said first insulation film during bonding of said bonding wire to said conductive interconnection layer.

* * * * *